United States Patent
Liu et al.

(10) Patent No.: US 8,377,816 B2
(45) Date of Patent: Feb. 19, 2013

(54) METHOD OF FORMING ELECTRICAL CONNECTIONS

(75) Inventors: Chung-Shi Liu, Shinchu (TW);
Shin-Puu Jeng, Hsinchu (TW);
Mirng-Ji Lii, Sinpu Township (TW);
Chen-Hua Yu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 143 days.

(21) Appl. No.: 12/768,025

(22) Filed: Apr. 27, 2010

(65) Prior Publication Data

US 2011/0027944 A1  Feb. 3, 2011

Related U.S. Application Data

(60) Provisional application No. 61/230,012, filed on Jul. 30, 2009.

(51) Int. Cl.
*H01L 21/44* (2006.01)
(52) U.S. Cl. ............................................... 438/613
(58) Field of Classification Search ........... 438/612–614
See application file for complete search history.

(56) References Cited

U.S. PATENT DOCUMENTS

| | | | |
|---|---|---|---|
| 3,528,090 A | 9/1970 | Van Laer | |
| 4,380,867 A | 4/1983 | Antson | |
| 4,720,740 A | 1/1988 | Clements et al. | |
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,134,460 A | 7/1992 | Brady et al. | |
| 5,380,681 A | 1/1995 | Hsu | |
| 5,391,917 A | 2/1995 | Gilmour et al. | |
| 5,466,635 A * | 11/1995 | Lynch et al. | 438/614 |
| 5,481,133 A | 1/1996 | Hsu | |
| 5,510,298 A | 4/1996 | Redwine | |
| 5,747,881 A | 5/1998 | Hosomi et al. | |
| 5,767,001 A | 6/1998 | Bertagnolli | |
| 5,943,597 A * | 8/1999 | Kleffner et al. | 438/613 |
| 5,998,292 A | 12/1999 | Black et al. | |

(Continued)

FOREIGN PATENT DOCUMENTS

| | | |
|---|---|---|
| JP | 05-335313 | 12/1993 |
| JP | 2000-228420 | 8/2000 |

OTHER PUBLICATIONS

U.S. Appl. No. 61/258,414, filed Nov. 5, 2009, Chien Ling Hwang, et al.

(Continued)

*Primary Examiner* — Jenny L Wagner
(74) *Attorney, Agent, or Firm* — Lowe Hauptman Ham & Berner, LLP (57) ABSTRACT

A method of forming electrical connections to a semiconductor wafer. A semiconductor wafer comprising an insulation layer is provided. The insulation layer has a surface. A patterned mask layer is formed over the surface of the insulation layer. The patterned mask layer exposes portions of the surface of the insulation layer through a plurality of holes. The portions of the plurality of holes are filled with a metal material comprising copper to form elongated columns of the metal material. The elongated columns of the metal material have a sidewall surface. The patterned mask layer is removed to expose the sidewall surface of the elongated columns of the metal material. A protection layer is formed on the exposed sidewall surface of the elongated columns of the metal material.

20 Claims, 5 Drawing Sheets

U.S. PATENT DOCUMENTS

| | | | |
|---|---|---|---|
| 6,002,177 A | 12/1999 | Gaynes et al. | |
| 6,184,060 B1 | 2/2001 | Siniaguine | |
| 6,186,392 B1 * | 2/2001 | Ball | 228/245 |
| 6,187,678 B1 | 2/2001 | Gaynes et al. | |
| 6,191,493 B1 | 2/2001 | Yasunaga et al. | |
| 6,218,281 B1 | 4/2001 | Watanabe et al. | |
| 6,229,216 B1 | 5/2001 | Ma et al. | |
| 6,229,220 B1 | 5/2001 | Saitoh et al. | |
| 6,232,563 B1 | 5/2001 | Kim et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,322,903 B1 | 11/2001 | Siniaguine et al. | |
| 6,355,501 B1 | 3/2002 | Fung et al. | |
| 6,426,556 B1 | 7/2002 | Lin | |
| 6,434,016 B2 | 8/2002 | Zeng et al. | |
| 6,448,168 B1 | 9/2002 | Rao et al. | |
| 6,448,661 B1 | 9/2002 | Kim et al. | |
| 6,464,895 B2 | 10/2002 | Forat et al. | |
| 6,465,892 B1 | 10/2002 | Suga | |
| 6,472,293 B1 | 10/2002 | Suga | |
| 6,492,198 B2 | 12/2002 | Hwang | |
| 6,538,333 B2 | 3/2003 | Kong | |
| 6,562,653 B1 | 5/2003 | Ma et al. | |
| 6,570,248 B1 | 5/2003 | Ahn et al. | |
| 6,576,381 B1 | 6/2003 | Hirano et al. | |
| 6,578,754 B1 | 6/2003 | Tung | |
| 6,592,019 B2 | 7/2003 | Tung | |
| 6,599,778 B2 | 7/2003 | Pogge et al. | |
| 6,600,222 B1 | 7/2003 | Levardo | |
| 6,607,938 B2 | 8/2003 | Kwon et al. | |
| 6,639,303 B2 | 10/2003 | Siniaguine | |
| 6,661,085 B2 | 12/2003 | Kellar et al. | |
| 6,664,129 B2 | 12/2003 | Siniaguine | |
| 6,693,361 B1 | 2/2004 | Siniaguine et al. | |
| 6,731,003 B2 | 5/2004 | Joshi et al. | |
| 6,740,582 B2 | 5/2004 | Siniaguine | |
| 6,762,076 B2 | 7/2004 | Kim et al. | |
| 6,770,958 B2 | 8/2004 | Wang et al. | |
| 6,790,748 B2 | 9/2004 | Kim et al. | |
| 6,800,930 B2 | 10/2004 | Jackson et al. | |
| 6,818,545 B2 | 11/2004 | Lee et al. | |
| 6,828,677 B2 | 12/2004 | Yap et al. | |
| 6,841,883 B1 | 1/2005 | Farnworth et al. | |
| 6,853,076 B2 | 2/2005 | Datta et al. | |
| 6,869,831 B2 | 3/2005 | Cowens et al. | |
| 6,879,041 B2 | 4/2005 | Yamamoto et al. | |
| 6,882,030 B2 | 4/2005 | Siniaguine | |
| 6,887,769 B2 | 5/2005 | Kellar et al. | |
| 6,908,565 B2 | 6/2005 | Kim et al. | |
| 6,908,785 B2 | 6/2005 | Kim | |
| 6,917,119 B2 | 7/2005 | Lee et al. | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,958,539 B2 | 10/2005 | Lay et al. | |
| 6,962,867 B2 | 11/2005 | Jackson et al. | |
| 6,962,872 B2 | 11/2005 | Chudzik et al. | |
| 6,975,016 B2 | 12/2005 | Kellar et al. | |
| 7,008,867 B2 | 3/2006 | Lei | |
| 7,012,333 B2 | 3/2006 | Shimoyama et al. | |
| 7,030,481 B2 | 4/2006 | Chudzik et al. | |
| 7,037,804 B2 | 5/2006 | Kellar et al. | |
| 7,049,170 B2 | 5/2006 | Savastiouk et al. | |
| 7,056,807 B2 | 6/2006 | Kellar et al. | |
| 7,060,601 B2 | 6/2006 | Savastiouk et al. | |
| 7,064,436 B2 | 6/2006 | Ishiguri et al. | |
| 7,071,546 B2 | 7/2006 | Fey et al. | |
| 7,087,538 B2 | 8/2006 | Staines et al. | |
| 7,111,149 B2 | 9/2006 | Eilert | |
| 7,122,912 B2 | 10/2006 | Matsui | |
| 7,151,009 B2 | 12/2006 | Kim et al. | |
| 7,157,787 B2 | 1/2007 | Kim et al. | |
| 7,193,308 B2 | 3/2007 | Matsui | |
| 7,215,033 B2 | 5/2007 | Lee et al. | |
| 7,262,495 B2 | 8/2007 | Chen et al. | |
| 7,271,497 B2 | 9/2007 | Joshi et al. | |
| 7,276,799 B2 | 10/2007 | Lee et al. | |
| 7,279,795 B2 | 10/2007 | Periaman et al. | |
| 7,297,574 B2 | 11/2007 | Thomas et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,335,972 B2 | 2/2008 | Chanchani | |
| 7,345,350 B2 | 3/2008 | Sinha | |
| 7,348,210 B2 | 3/2008 | Daubenspeck et al. | |
| 7,355,273 B2 | 4/2008 | Jackson et al. | |
| 7,391,112 B2 | 6/2008 | Li et al. | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,462,942 B2 | 12/2008 | Tan et al. | |
| 7,494,845 B2 | 2/2009 | Hwang et al. | |
| 7,501,311 B2 | 3/2009 | Tsai | |
| 7,524,755 B2 | 4/2009 | Widodo et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,566,650 B2 | 7/2009 | Lin et al. | |
| 7,576,435 B2 | 8/2009 | Chao | |
| 7,592,246 B2 | 9/2009 | Akram | |
| 7,648,899 B1 | 1/2010 | Banerji et al. | |
| 7,825,511 B2 | 11/2010 | Daubenspeck et al. | |
| 7,834,450 B2 | 11/2010 | Kang | |
| 7,928,534 B2 | 4/2011 | Hsu et al. | |
| 2001/0000321 A1 | 4/2001 | Takeda et al. | |
| 2002/0014705 A1 | 2/2002 | Ishio et al. | |
| 2002/0033531 A1 | 3/2002 | Matsushima et al. | |
| 2003/0156969 A1 | 8/2003 | Choi et al. | |
| 2003/0216025 A1 | 11/2003 | Lu et al. | |
| 2004/0166661 A1 | 8/2004 | Lei | |
| 2005/0001324 A1 | 1/2005 | Dunn et al. | |
| 2005/0077624 A1 | 4/2005 | Tan et al. | |
| 2005/0179131 A1 | 8/2005 | Homma | |
| 2006/0043603 A1 | 3/2006 | Ranade et al. | |
| 2006/0166402 A1 | 7/2006 | Lim et al. | |
| 2006/0237842 A1 | 10/2006 | Shindo | |
| 2006/0278982 A1 | 12/2006 | Solo De Zaldivar | |
| 2007/0023904 A1 | 2/2007 | Salmon | |
| 2007/0080421 A1 | 4/2007 | Lee et al. | |
| 2007/0108606 A1 | 5/2007 | Watanabe | |
| 2007/0284684 A1 | 12/2007 | Naito et al. | |
| 2007/0287279 A1 | 12/2007 | Daubenspeck et al. | |
| 2008/0296764 A1 | 12/2008 | Chang et al. | |
| 2009/0011543 A1 | 1/2009 | Karta et al. | |
| 2009/0026608 A1 | 1/2009 | Tsai et al. | |
| 2009/0045511 A1 | 2/2009 | Meyer et al. | |
| 2009/0096109 A1 | 4/2009 | Iwasaki | |
| 2009/0098724 A1 | 4/2009 | Yu | |
| 2009/0130840 A1 | 5/2009 | Wang et al. | |
| 2009/0197114 A1 | 8/2009 | Shih et al. | |
| 2009/0229857 A1 | 9/2009 | Fredenberg et al. | |
| 2010/0090318 A1 | 4/2010 | Hsu et al. | |
| 2010/0109159 A1 | 5/2010 | Ho et al. | |
| 2010/0230810 A1 | 9/2010 | Kang et al. | |
| 2011/0101523 A1 | 5/2011 | Hwang et al. | |
| 2011/0101526 A1 | 5/2011 | Hsiao et al. | |
| 2011/0156256 A1 | 6/2011 | Kang et al. | |
| 2011/0227216 A1 | 9/2011 | Tseng et al. | |
| 2011/0281432 A1 | 11/2011 | Farooq et al. | |

OTHER PUBLICATIONS

U.S. Appl. No. 61/238,749, filed Sep. 1, 2009, Chung-Shi Liu.

U.S. Appl. No. 61/258,393, filed Nov. 5, 2009, Chien Ling Hwang, et al.

Kim, K. S., et al., "The Interface Formation and Adhesion of Metals (Cu, Ta, and Ti) and Low Dielectric Constant Polymer-Like Organic Thin Films Deposited by Plasma-Enhanced Chemical Vapor Deposition Using Para-Xylene Precursor", Thin Solid Films 377-378 (2000), pp. 122-128.

Kim, K. J., et al., "Chemical Interaction, Adhesion and Diffusion Properties at the Interface of Cu and Plasma-Treated Thiophene- Based Plasma Polymer (ThioPP) Films", Thin Solid Films 398-399 (2001), pp. 657-662.

Du, M., et al., "The Interface Formation of Copper and Low Dielectric Constant Fluoro-Polymer: Plasma Surface Modification and its Effect on Copper Diffusion", Journal of Applied Physics, vol. 85, No. 3, Feb. 1, 1999, pp. 1496-1502.

Jiang, Liang-You, et al., "Reduced Copper Diffusion in Layered Silicate/Fluorinated Polyimide (6FDS-ODA) Nanocomposites", Journal of Applied Polymer Science, vol. 92, 1422-1425 (2004).

* cited by examiner

METHOD OF FORMING ELECTRICAL CONNECTIONS

CROSS-REFERENCE TO RELATED APPLICATIONS

The present application claims priority of U.S. Provisional Patent Application Ser. No. 61/230,012 filed on Jul. 30, 2009 which is incorporated herein by reference in its entirety.

TECHNICAL FIELD

The disclosure relates generally to semiconductor bump processes, and more particularly to methods for protecting electrical connections in bump processes.

BACKGROUND

Flip chip technology plays an important role in the packaging of semiconductor devices. A flip chip microelectronic assembly includes a direct electrical connection of face down electronic components onto substrates, such as circuit boards, using solder bumps as the interconnects. The use of flip chip packaging has dramatically grown as a result of the flip chips advantages in size, performance and flexibility over other packaging methods.

Recently, copper interconnect post technology has been developed. Instead of using solder bumps, electronic components are connected to substrates by means of copper posts. The copper interconnect post technology achieves finer pitch with minimum probability of bump birdging, reduces the capacitance load of the circuits and allows the electronic components to perform at higher frequencies.

However, copper has a tendency to be oxidized during the manufacturing process. Oxidized copper posts may lead to poor adhesion of an electronic component to a substrate. The poor adhesion may cause serious reliability concerns due to high leakage currents. Oxidized copper posts may also lead to underfill cracking along the interface of the underfill and the copper posts. The cracks may propagate to the underlying low-K dielectric layers or to the solder used to bond the copper posts to the substrate.

Accordingly, there is a need for an improved method to form electrical connections to a semiconductor wafer with robust electrical performance.

BRIEF DESCRIPTION OF THE DRAWINGS

The disclosure will be described with reference to embodiments thereof as illustrated in the accompanying figures. It should be understood that the drawings are for illustrative purposes and are therefore not drawn to scale.

DETAILED DESCRIPTION

The making and using of illustrative embodiments are discussed in detail below. It should be appreciated, however, that the disclosure provides many applicable concepts that can be embodied in a wide variety of specific contexts. The specific embodiments discussed are merely illustrative of specific ways to make and use the disclosure, and do not limit the scope of invention.

FIGS. 1 to 6 depict a first embodiment of a method for fabricating electrical connections to a semiconductor wafer. FIG. 1A is a cross-sectional view of a wafer 100 including a plurality of semiconductor chips 001 fabricated on the surface of the wafer 100. FIG. 1B is a plan view of the wafer 100. The plurality of semiconductor chips 001 are divided by scribe lines (not shown) between each of the chips. The term "wafer" as described herein, generally refers to a semiconductor substrate on which various layers and integrated circuits are formed. The wafer may comprise silicon or compound semiconductor, such as GaAs, InP, Si/Ge, or SiC. Examples of layers may include dielectric layers, doped layers, metal layers, polysilicon layers and via plugs that may connect one layer to one or more layers. Examples of integrated circuits may include transistors, resistors, and/or capacitors.

Figure 1A:
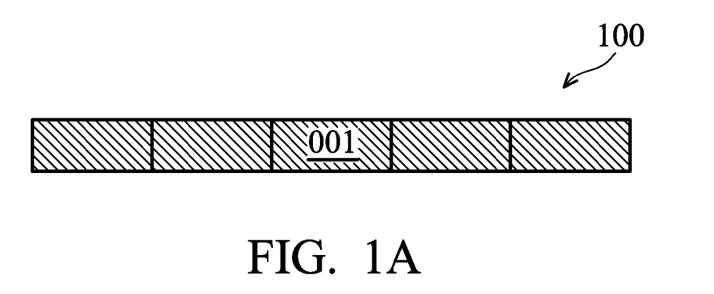
FIGS. 1A and 1B are the cross-sectional view and the plan view of a wafer having a plurality of semiconductor chips fabricated on the surface of the wafer.
Figure 1B:
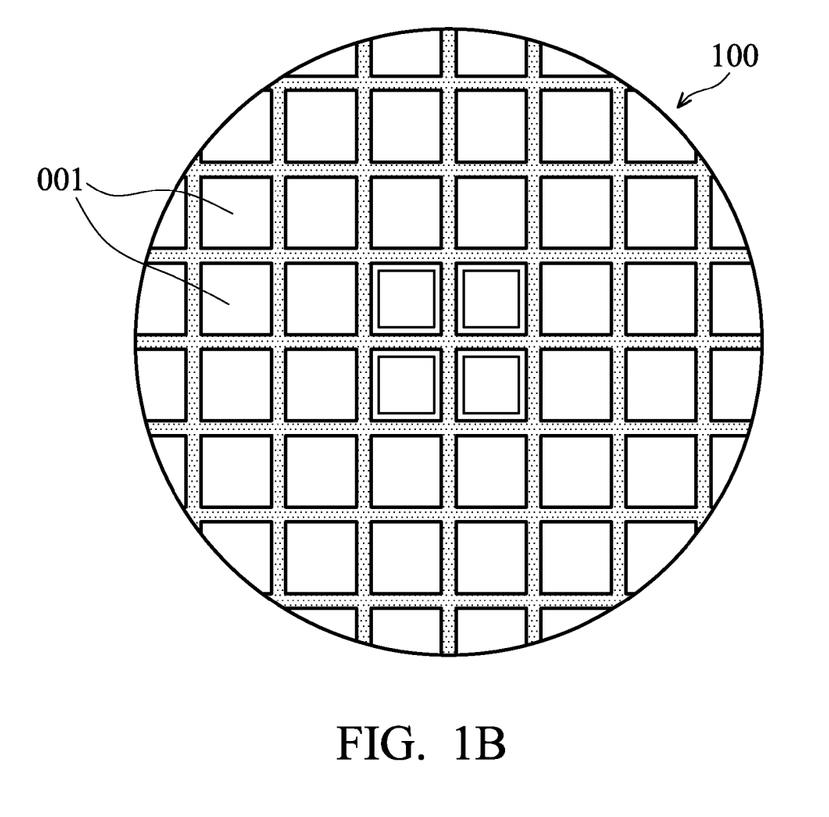
Figure 2:
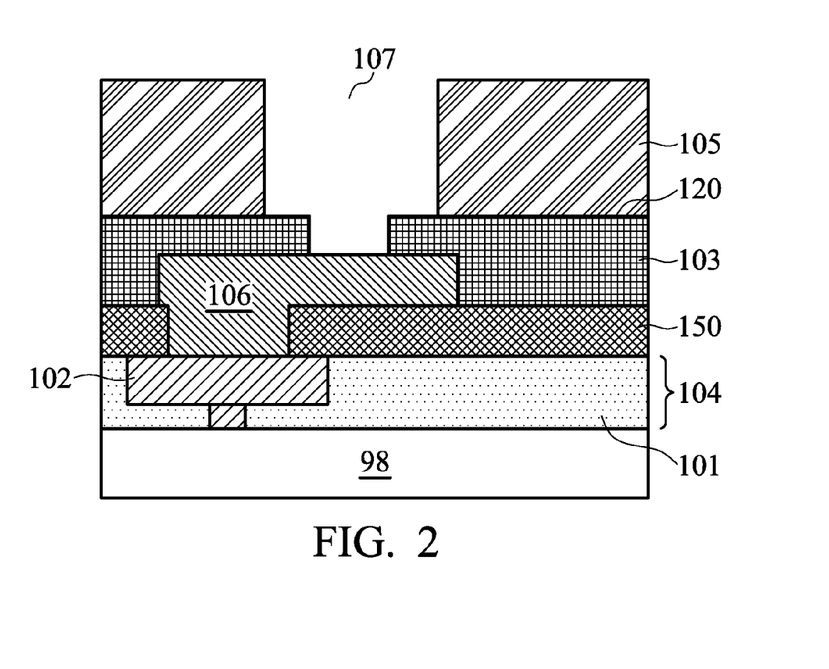
FIG. 2 is a cross-sectional view of a semiconductor device depicting a patterned mask layer that is formed thereover, according to one embodiment of the present disclosure.

FIG. 2 is a cross-sectional view of the wafer 100. Integrated circuits (not shown) are formed on the surface of semiconductor substrate 98 of wafer 100. Interconnect layers 104 include one or more layers of conductive layers 102 disposed within one or more layers of dielectric layers 101. The conductive layers 102 are formed over the integrated circuits to make electrical connections from the integrated circuits to the upper layer. A passivation layer 150 is formed over the interconnect layers 104 to protect the integrated circuits and interconnect layers 104 from damage and contamination. Redistribution layer (RDL) 106, which is conductive, is formed on the top of the passivation layer 150 to extend the electrical connectivity from interconnect layer 104. The interconnect layer 104 and RDL 106 form a conductive path that electrically contacts with the integrated circuit. An insulation layer 103 made of, for example polyimide, is formed over the RDL layer 106 and exposes a portion of underlying RDL layer 106. A mask layer 105 having a thickness in a range of about 30 μm to 50 μm is formed over a surface 120 of the insulation layer 103. Various designated areas of the mask layer 105 are patterned to form a plurality of through-holes 107 to expose the surface 120 of the insulation layer 103. The hole 107 also exposes a portion of the underlying RDL layer 106. In one embodiment, the mask layer 105 may be formed by a photosensitive layer, such as a photoresist layer. A photoresist layer is patterned by exposing the layer to radiation. The radiation causes the photoresist to become more soluble (positive resist) or less soluble (negative resist) in a developer solution. The change in solubility allows portions of the resist layer to be selectively removed to form a pattern. Normally, negative photo resist is preferred. In another embodiment, the mask layer 105 comprises any suitable material that can be patterned according to methods familiar to the skilled person in the art.

Figure 3:
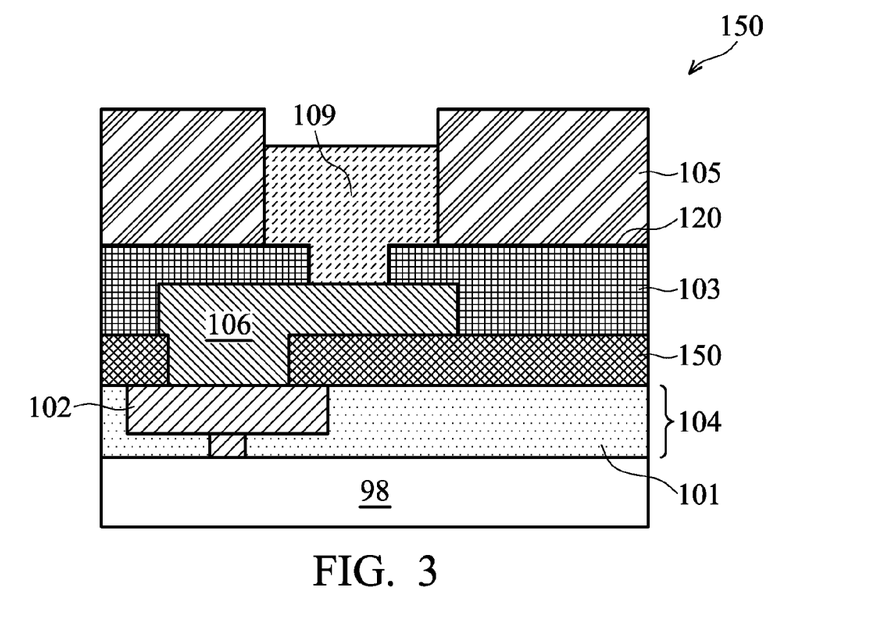
FIG. 3 is a cross-sectional view of the semiconductor device of FIG. 2 depicting a metal material filling in an opening at the patterned mask layer.

FIG. 3 illustrates portions of the plurality of holes 107 are filled with a metal material 109. A plurality of elongated columns of metal material 109 are formed in holes 107 and protrudes from the surface 120 of the insulation layer 103. The elongated columns of metal material 109 contacts with RDL layer 106 and provide electrical connection to the underlying integrated circuits. In one embodiment, the elongated columns of metal material 109 including copper may be formed by electroless plating to fill portions of the plurality of holes 107.

Figure 4:
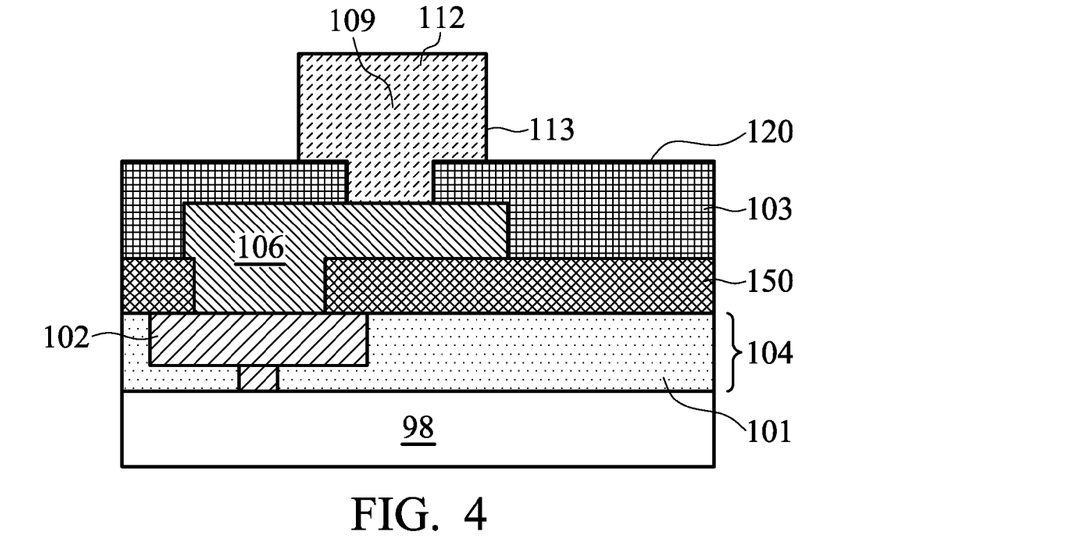
FIG. 4 shows the patterned mask layer in FIG. 3 removed to expose the elongated column of metal material.

FIG. 4 illustrates the structure when the patterned mask layer 105 in FIG. 3 is removed. A top surface 112 and a sidewall surface 113 of the elongated columns of metal material 109 are exposed. In one embodiment, the removing process comprises a wet etching or a dry etching process or any suitable method being familiar to those skilled in the art.

Figure 5:
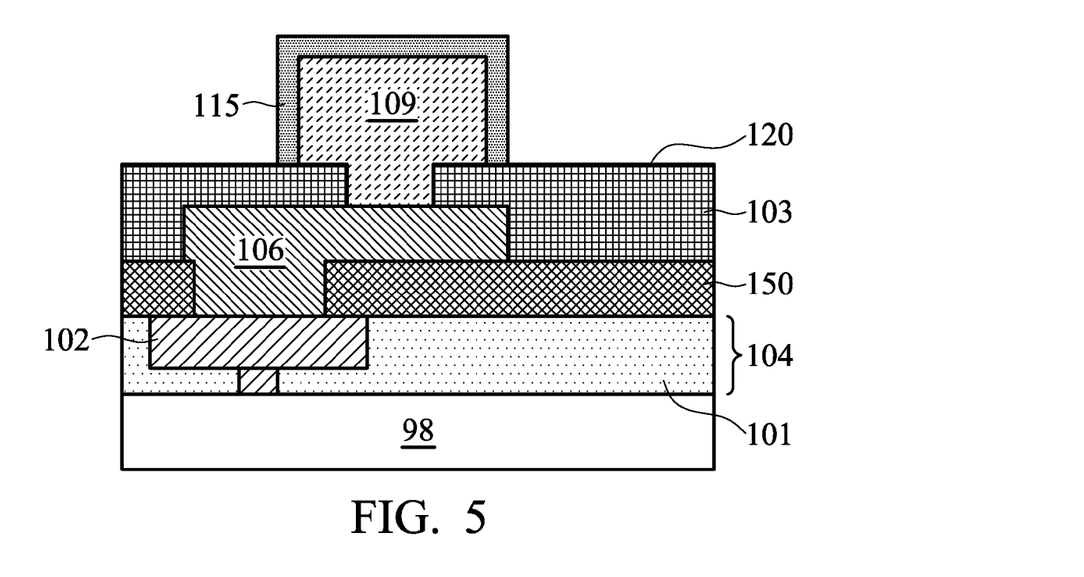
FIG. 5 shows a protection layer formed on the surface of the elongated column of metal material in FIG. 4.

FIG. 5 illustrates a protection layer 115 formed on the surfaces, including the top surface 112 and the sidewall surface 113, of the elongated columns of metal material 109. By employing materials that selectively react with copper, the protection layer 115 may be selectively formed on the surface of the elongated columns of metal material 109 without being formed on the surface 120 of the insulation layer 103. In one embodiment, the elongated columns of metal material 109 are exposed to an environment containing a chemical vapor deposition (CVD) gaseous precursor comprising Sn, Si or Ge. The gaseous precursor comprises at least one of $SnCl_4$, $SnH_4$, $GeH_4$, $Ge_2H_6$, $SiH_4$, $Si_2H_6$, tetrabutyl tin ($Sn(nBu)_4$), tetramethyl tin ($SnMe_4$), tetraethyl tin ($SnEt_4$), or tetraisopropyl tin ($Sn(iPr)_4$). The gaseous precursor reacts with the copper in the metal material 109 to form the protection layer 115 on the surface of the elongated columns of metal material 109. The CVD process may be performed under a pressure range of 1 mTorr to 10 Torr and a temperature range of 100 to 400° C. The protection layer 115 is a copper-containing compound that is chemically stable and conformal. Since the gaseous precursor comprises Sn, Si or Ge, the protection layer 115 may comprise Sn, Si or Ge. In some embodiments, the copper-containing compound may contain other elements such as nitrogen.

In other embodiments, the protection layer 115 is formed by plating instead of CVD. In some of those embodiments, the elongated columns of metal material 109 are immersed in an electroless plating solution containing Sn. Sn is deposited on the elongated columns of metal material 109 by a chemical reduction process which, once initiated, is autocatalytic. Sn ions in the electroless solution are reduced by chemical agents in the solution, and deposit on the surfaces, including the top surface 112 and the sidewall surface 113, of the elongated columns of metal material 109. The solution may be maintained at a predetermined temperature within a range of about 25° C. to about 100° C. The solution may be maintained at a predetermined Sn concentration within a range of 2 g/liter to 50 g/liter. Since the plating reaction only occurs on the surface of the elongated columns of metal material 109, the protection layer 115 is selectively formed on the top surface 112 and the sidewall surface 113. No tin will be plated on the surface 120 of the insulation layer 103.

The protection layer 115 may prevent the elongated columns of metal material 109 from oxidation and also improve the adhesion between elongated columns of metal material 109 and the underfill in the following package process.

Figure 6:
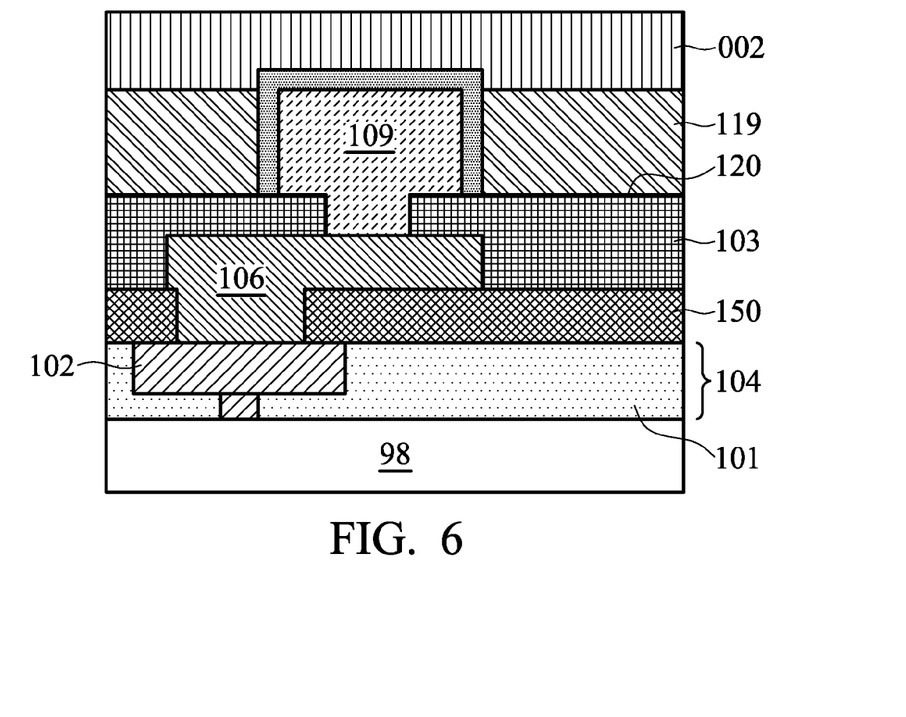
FIG. 6 shows a semiconductor component bonded to the chip.

FIG. 6 illustrates a cross-sectional view of a semiconductor device. The semiconductor chip 001 is bonded to a semiconductor component 002 using the elongated columns of metal material 109 shown in FIG. 5. For the sake of simplicity and brevity, the semiconductor component 002 is shown as a simple chip without further details. In one embodiment, the semiconductor component 002 may include semiconductor chip, carrier substrate, circuit board or any suitable component familiar to those skilled in the art. The semiconductor chip 001 and the semiconductor component 002 could be electrically connected through the elongated columns of metal material 109. The bonding methods comprise copper-to-copper bonding, solder bonding or any suitable method familiar to those skilled in the art.

After the bonding process, a gap is defined between the semiconductor chip 001 and the semiconductor component 002. An underfill 119 is filled in this gap to protect the elongated columns of metal material 109 and increase the reliability of the package. The underfill reduces stress between the elongated columns of metal material and the substrates, and spreads the heat uniformly within this stacked semiconductor device. The underfill 119 may include, but is not limited to, epoxies, polyimides or other thermoplastic or thermoset materials or any suitable material familiar to those skilled in the art.

Figure 7:
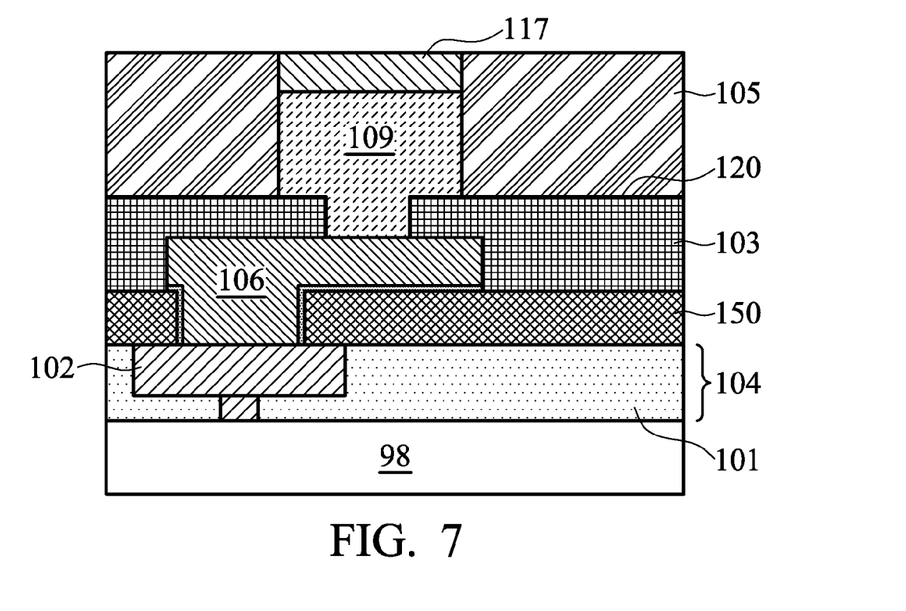
FIG. 7 shows a conductive material formed on the top surface of the elongated column of metal material.
Figure 8:
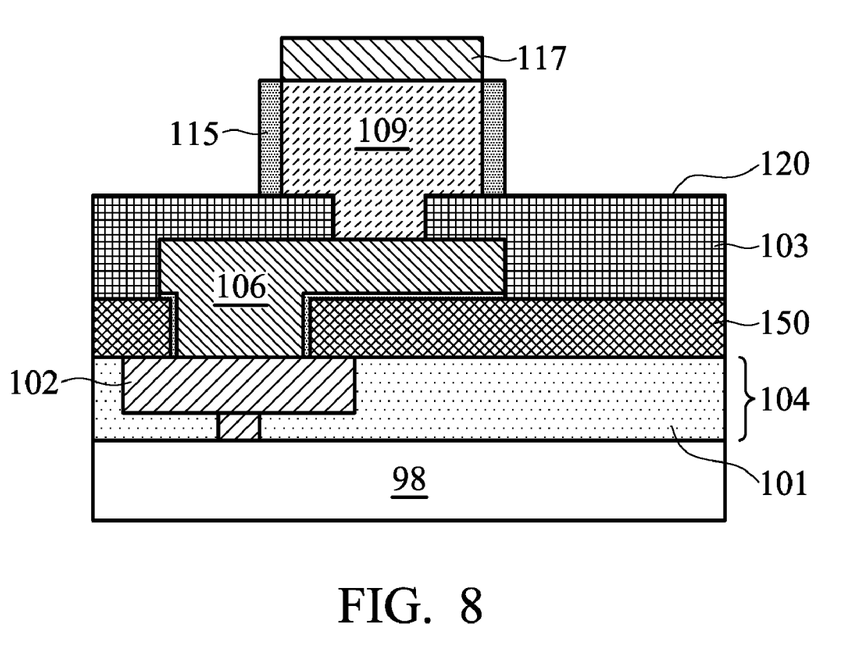
FIG. 8 a protection layer formed on the sidewall surface of the elongated column of metal material in FIG. 7.

FIGS. 7 and 8 illustrate a variation of the process steps of FIGS. 3 to 5. As shown in FIG. 7, a conductive material 117 is formed on the top surface 112 of the elongated columns of metal material 109. In one embodiment, the conductive material 117 is formed by electroless plating to fill the space defined by the patterned mask layer 105 and the top surface 112 of the elongated columns of metal material 109. The conductive material 117 comprises Ni, Sn, Au, Pd or other similar materials or alloy. The conductive material 117 could act as a barrier layer to prevent copper in the elongated columns of metal material 109 to diffuse into the bonding material, such as solder, that is used to bond the elongated columns of metal material 109 and the semiconductor component 002. The prevention of copper diffusion increases the reliability and bonding strength of the package.

FIG. 8 illustrates the structure when the patterned mask layer 105 in FIG. 7 is removed. The sidewall surface 113 of the elongated columns of metal material 109 is exposed. Then, the protection layer 115 may be selectively formed on the sidewall surface 113 of the elongated columns of metal material 109 without forming on the surface of the insulation layer 103.

Although the present disclosure and its advantages have been described in detail, it should be understood that various changes, substitutions and alterations can be made herein without departing from the spirit and scope of the invention. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming electrical connections to a semiconductor wafer, the method comprising:

providing a semiconductor wafer comprising an insulation layer, the insulation layer having a surface;

forming an elongated column of a metal material comprising copper, protruding from the surface of the insulation layer, wherein the elongated columns of the metal material have a sidewall surface;

forming a protection layer by an electroless plating process on the sidewall surface of the elongated columns of the metal material, wherein the protection layer comprises Sn; and covering a top surface of the elongated columns with a conductive material by an electroless plating process, the conductive material being discontinuous with the protection layer.

2. The method of claim 1, further comprising:
forming the protection layer on a top surface of the elongated column of the metal material.

3. The method of claim 1, wherein
the covering the top surface of the elongated columns of the metal material with a conductive material occurs before the step of forming the protection layer.

4. The method of claim 1, wherein the step of forming the protection layer comprises immersing the elongated column of the metal material in an electroless plating solution containing Sn.

5. The method of claim 4, wherein the electroless plating solution is at a temperature in the range of between 25° C. and 100° C.

6. The method of claim 4, wherein the electroless plating solution contains Sn at a concentration in the range of between 2 g/liter and 50 g/liter.

7. The method of claim 3, wherein the conductive material comprises Ni, Sn, Au or Pd.

8. The method of claim 3, wherein the semiconductor wafer comprises an integrated circuit and the elongated column of the metal material electrically contacts with the integrated circuit.

9. A method of forming electrical connections to a semiconductor wafer, the method comprising:
providing a semiconductor wafer comprising an integrated circuit;
forming an insulation layer having a surface over the semiconductor wafer, wherein a conductive path is underlying the insulation layer and electrically contacts with the integrated circuit;
forming an elongated column of metal material comprising copper, having sidewalls, protruding from the surface of the insulation layer, wherein the elongated column of metal material contacts with the conductive path through the insulation layer; and
forming a discontinuous protection layer on the sidewalls by exposing the elongated column of metal material to a gaseous precursor containing Sn, Si or Ge that reacts with copper in the metal material.

10. The method of claim 9, further comprising:
forming the protection layer on a top surface of the elongated column of metal material.

11. The method of claim 9, further comprising:
covering a top surface of the elongated column of metal material with a conductive material before the step of forming the protection layer.

12. The method of claim 9, wherein the gaseous precursor is at a pressure in the range of between 1 mTorr and 10 Torr.

13. The method of claim 9, wherein the gaseous precursor is under at a temperature in the range of between 100 and 400° C.

14. The method of claim 9, wherein the gaseous precursor comprises $SnCl_4$, $SnH_4$, $GeH_4$, $Ge2H_6$, $SiH_4$, $Si_2H_6$, $Sn(nBu)_4$, $SnMe_4$, $SnEt_4$, or $Sn(iPr)_4$.

15. The method of claim 9, wherein the protection layer comprises Sn, Si or Ge.

16. A method of forming a semiconductor device, the method comprising:
providing a semiconductor chip;
forming an insulation layer over the semiconductor chip, the insulation layer having a surface;
forming an elongated column of metal material comprising copper, having sidewalls, protruding from the surface of the insulation layer;
forming a discontinuous protection layer on the sidewalls by exposing the elongated column of metal material to a gaseous precursor containing Sn, Si or Ge that reacts with copper in the metal material; and
bonding a semiconductor component onto the elongated column of metal material of the semiconductor chip, the semiconductor component electrically connecting the semiconductor chip.

17. The method of claim 16, further comprising:
forming the protection layer on a top surface of the elongated column of metal material.

18. The method of claim 16, further comprising:
covering a top surface of the elongated column of metal material with a conductive material before the step of forming the protection layer.

19. The method of claim 16, wherein the gaseous precursor comprises at least of $SnCl_4$, $SnH_4$, $GeH_4$, $Ge2H_6$, $SiH_4$, $Si_2H_6$, $Sn(nBu)_4$, $SnMe_4$, $SnEt_4$, or $Sn(iPr)_4$.

20. The method of claim 16, further comprising:
filling an underfill between a gap defined between the semiconductor chip and the semiconductor component.

* * * * *